(12) United States Patent
Ohshima

(10) Patent No.: US 9,064,579 B2
(45) Date of Patent: Jun. 23, 2015

(54) SEMICONDUCTOR MEMORY APPARATUS, DATA TRANSMISSION DEVICE, AND RECORDING METHOD

(71) Applicant: Gen Ohshima, Tokyo (JP)

(72) Inventor: Gen Ohshima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 13/722,361

(22) Filed: Dec. 20, 2012

(65) Prior Publication Data

US 2014/0016412 A1    Jan. 16, 2014

Related U.S. Application Data

(60) Provisional application No. 61/672,085, filed on Jul. 16, 2012.

(51) Int. Cl.
| | |
|---|---|
| G06F 11/00 | (2006.01) |
| G11C 16/06 | (2006.01) |
| G06F 13/16 | (2006.01) |
| G11C 16/10 | (2006.01) |
| G11C 16/34 | (2006.01) |

(52) U.S. Cl.
CPC ........ *G11C 16/06* (2013.01); *G06F 2212/1036* (2013.01); *G06F 2212/1041* (2013.01); *G06F 13/16* (2013.01); *G11C 16/102* (2013.01); *G11C 16/349* (2013.01)

(58) Field of Classification Search
CPC ................ G06F 2212/1036; G06F 2212/1041; G06F 13/16; G06F 3/0616; G06F 3/0604; G06F 3/0679; G06F 12/0246; G06F 3/0611; G06F 3/0619; G06F 3/0634; G06F 2212/7204; G06F 2212/7211; G06F 2212/214; G11C 16/06; G11C 16/102; G11C 16/349
See application file for complete search history.

(56) References Cited

U.S. PATENT DOCUMENTS

| | | | | |
|---|---|---|---|---|
| 5,406,529 | A * | 4/1995 | Asano | 365/230.03 |
| 7,809,900 | B2 * | 10/2010 | Danilak | 711/154 |
| 8,583,972 | B2 * | 11/2013 | Hida et al. | 714/723 |
| 8,631,191 | B2 * | 1/2014 | Hashimoto | 711/103 |
| 2005/0281088 | A1 * | 12/2005 | Ishidoshiro et al. | 365/185.29 |
| 2006/0031626 | A1 * | 2/2006 | Rapp et al. | 711/103 |
| 2006/0249585 | A1 * | 11/2006 | Hammerschmitt et al. | 235/492 |
| 2008/0126719 | A1 * | 5/2008 | Danilak | 711/154 |
| 2010/0161881 | A1 * | 6/2010 | Nagadomi et al. | 711/103 |

(Continued)

FOREIGN PATENT DOCUMENTS

| | | |
|---|---|---|
| JP | 2010-511225 | 4/2010 |
| JP | 2010-237854 | 10/2010 |

(Continued)

*Primary Examiner* — John P Trimmings
(74) *Attorney, Agent, or Firm* — Oblon, McClelland, Maier & Neustadt, L.L.P.

(57) ABSTRACT

According to one embodiment, a semiconductor memory apparatus includes a memory and a speed control unit. The speed control unit calculates a time-varying behavior of a permissible value of an accumulated amount of data written in the non-volatile semiconductor memory, where, after a start of a guaranteed period, data is written in the memory at a constant write speed so that the permissible value at an end time of the guaranteed period is equal to a sum of a first capacity and a second capacity. The first capacity is an accumulated amount of data written in the memory. The second capacity is an accumulated amount of data which is writable in the memory in a remaining time of the guaranteed period based on remaining rewritable times of existing blocks. The speed control unit controls a transmission speed of data from a host based on the permissible value.

20 Claims, 9 Drawing Sheets

(56) References Cited

U.S. PATENT DOCUMENTS

2010/0251039 A1* 9/2010 Hirohata et al. ............. 714/704
2011/0264842 A1   10/2011 Nakanishi et al.

FOREIGN PATENT DOCUMENTS

WO   WO 2008/063647 A2   5/2008
WO   WO 2009/001519 A1   12/2008

* cited by examiner

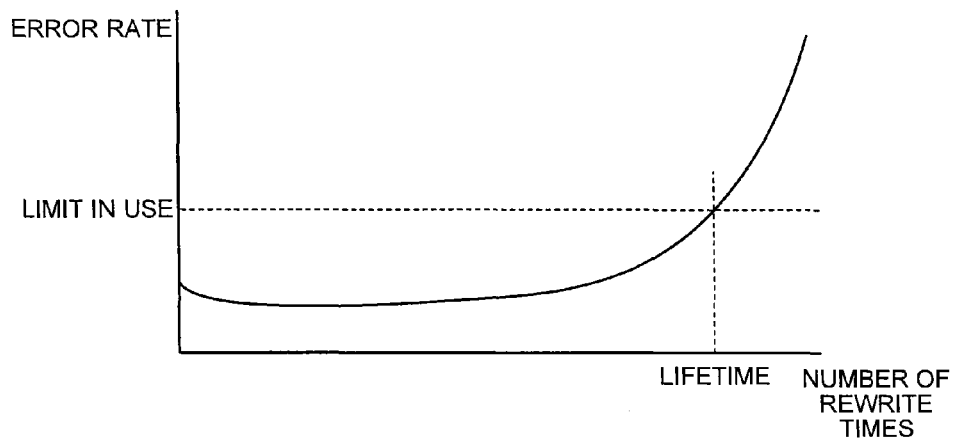
FIG.3
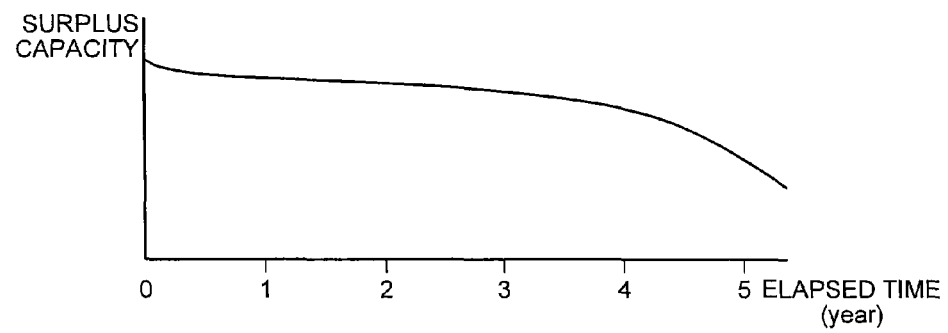
FIG.4
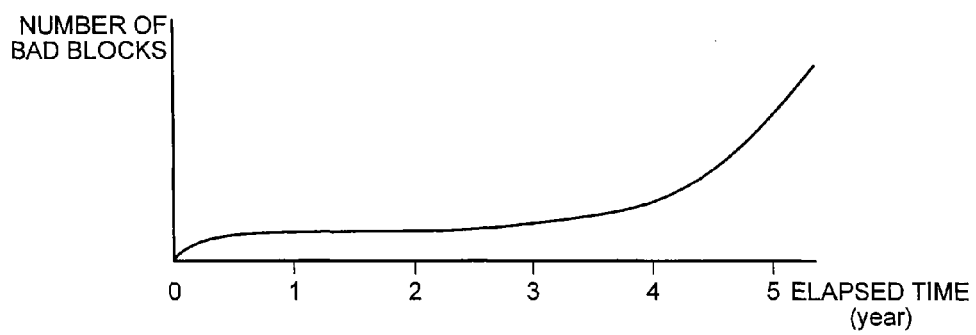

SEMICONDUCTOR MEMORY APPARATUS, DATA TRANSMISSION DEVICE, AND RECORDING METHOD

CROSS-REFERENCE TO RELATED APPLICATIONS

This application is based upon and claims the benefit of priority from U.S. Provisional Patent Application No. 61/672,085, filed on Jul. 16, 2012; the entire contents of which are incorporated herein by reference.

FIELD

Embodiments described herein relate generally to a semiconductor memory apparatus, a data transmission device, and a recording method.

BACKGROUND

As external memory apparatuses used for computer systems, semiconductor memory apparatuses such as an SSD (Solid State Drive) equipped with a non-volatile semiconductor memory such as a NAND type flash memory (hereinafter, simply referred to as a NAND memory) have attracted attention. In comparison with a magnetic disc apparatus, the semiconductor memory apparatus has advantages in high speed, light weight, and the like. Herein, the NAND memory has a structure capable of erasing data at one time, which is stored in a plurality of memory cells called blocks. However, it is known that the NAND memory has an upper limit in the number of rewrite times.

BRIEF DESCRIPTION OF THE DRAWINGS

FIG. 3 is a diagram for explaining a relationship between the number of rewrite times and an error rate of a NAND memory.
FIG. 4 is a diagram for explaining time transitions of a surplus capacity and the number of bad blocks.

DETAILED DESCRIPTION

Figure 1:
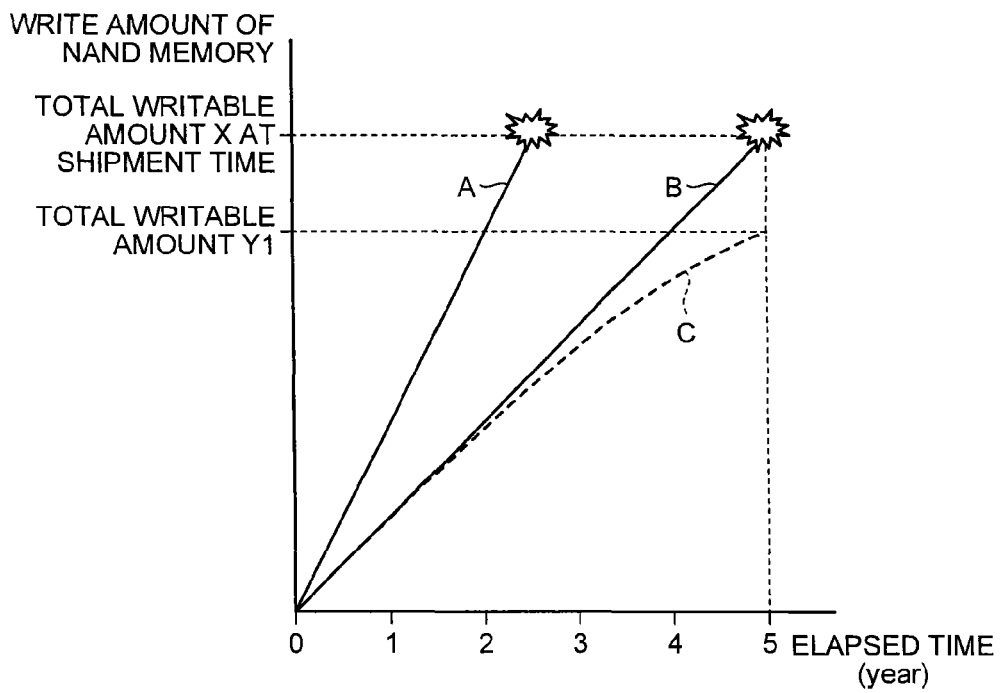
FIG. 1 is a diagram for explaining a write pace of a NAND memory.

According to one embodiment, a semiconductor memory apparatus includes a non-volatile semiconductor memory, a time measurement unit, a first capacity measurement unit, a second capacity calculation unit and a speed control unit. The non-volatile semiconductor memory includes a plurality of blocks having an upper limit in the number of rewrite times. The time measurement unit measures a total operation time counted from a start time of a guaranteed period. The first capacity measurement unit measures a first capacity which is an actual value of an accumulated amount of data written in the non-volatile semiconductor memory. The second capacity calculation unit calculates a second capacity which is an accumulated amount of data which is writable in the non-volatile semiconductor memory in a remaining time interval of the guaranteed period based on the number of remaining rewritable times of existing blocks among the plurality of the blocks. The speed control unit calculates a time-varying behavior of a permissible value of the accumulated amount of data written in the non-volatile semiconductor memory, where, after the start of the guaranteed period, data is written in the non-volatile semiconductor memory at a constant write speed so that the permissible value at an end time of the guaranteed period is equal to a sum of the first capacity and the second capacity. The speed control unit controls a transmission speed of transmission data from outside so that the first capacity does not exceed the permissible value at the timing of measuring the first capacity.

Hereinafter, a semiconductor memory apparatus, a data transmission device, and a recording method according to embodiments will be described in detail with reference to the accompanying drawings. In addition, the present invention is not limited to these embodiments.

In general, a so-called "semiconductor memory apparatus for enterprise" used for a server or a storage device has been required to have a quality that it is used for a predetermined period (for example, five years) with maximum performance being retained. Since a NAND memory used for most of semiconductor memory apparatuses have a limitation in use (lifetime) due to a limit of the number of rewrite times, an SLC (Single Level Cell)-structure NAND memory excellent in the number of rewritable times is applied to the semiconductor memory apparatus used in the aforementioned purposes, so that five-year writing with maximum performance being retained can be sustained. However, in actual cases, there is almost no need to sustain the state where writing is performed in a write pace with the maximum performance for five years, and the full performance of the expensive SLC is not used all up. On the other hand, semiconductor memory apparatuses used for a server or a storage device, which employ an MLC (multi level cell) type NAND memory (particularly, a 2-bit/cell type) and of which an instantaneous write performance is close to that of the SLC type, have appeared. Herein, the write speed and the number of rewrite times of the MCL type NAND memory are lower than those of the SLC type, but the price thereof is half of that of the SLC. The improvement in the writing performance of the semiconductor memory apparatus is implemented, for example, by increasing concurrency of chips constituting the NAND memory. Since of the number of write times is strictly limited and the write speed is improved, the semiconductor memory apparatus employing the MLC type NAND memory may not satisfy the durable use period of five years at the maximum performance. In the actual case, since the writing at the write speed of the maximum performance is not continuously performed for five years, the semiconductor memory apparatus employing the MLC type NAND memory can be sufficiently used for practical use. However, actually, there is no guarantee in that a write amount (hereinafter, referred to as a total write amount) obtained from integration from an apparatus shipment time does not exceed a total amount (hereinafter, referred to as a total writable amount) defined based on the limitation of the number of rewrite times within a to-be-achieved durable use period. In addition, hereinafter, the value of limit of the number of rewrite times is referred to as the number of rewritable times.

With respect to this problem, U.S. Pat. No. 7,809,900 discloses a technique of a semiconductor memory apparatus that estimates a lifetime of the apparatus after writing and decreases a performing speed of the writing in comparison with a target write pace, when writing is to be performed. This technique does not simply decrease the performing speed at the time when a threshold value is exceeded, but it equalizes the performing speed by integrating the write pace so that the performing speed is not decreased unnecessarily.

However, in order to achieve the performance of the enterprise-dedicated semiconductor memory apparatus which exceeds, for example, 250,000 IOPS, a process of one command needs to be performed within at most 4 μsec. In this manner, it is difficult to perform calculation of lifetime estimation within such a limited time interval. Practically, the estimation calculation may be performed in a device driver by using a force of a main CPU. However, it should be noted that the overall performance of the system greatly deteriorates due to the use of the main CPU in the estimation calculation. In practical cases, there is a need for a method of efficiently controlling in the semiconductor memory apparatus using a simpler calculation method without exerting a load to the main CPU.

In addition, it should be noted that a block which may not be used during the operation due to deterioration of the memory cells constituting the NAND memory occurs in an actual semiconductor memory apparatus. The blocks which may not be used are referred to as bad blocks. Due to the bad blocks, a usable storage area is decreased as time elapses. If correction is not performed on the decrease in the usable storage area, the lifetime may be ended before it reaches the originally-considered durable use period. The frequency of occurrence of the bad blocks varies with the use environment, usage (work load), or a difference between individual products. This denotes that an ideal write pace, that is, a standard write pace for allowing the lifetime to be ended at the end of the guaranteed period needs to be corrected dynamically according to the conditions. However, the technique disclosed in Patent Document 1 does not consider this point.

Therefore, according to an embodiment of the present invention, the semiconductor memory apparatus calculates a total writable amount which is dynamically changed according to the environment to dynamically obtain the ideal write pace and intentionally decreases only the writing performance so that the write pace at that time does not exceed the ideal write pace. In addition, in the embodiment, the write pace denotes a time transition of an accumulated amount (write amount) of write data for a NAND memory.

Before the configuration is described in detail, an operational principle of a semiconductor memory apparatus according to an embodiment of the present invention will be described.

FIG. 1 is a diagram for explaining a write pace for a NAND memory. A straight line A is a graph illustrating a relation between a total write amount and an elapsed time in the case where the maximum writing performance of the semiconductor memory apparatus is sustained. The total writable amount X denotes an accumulated amount of data which can be written from the product shipment state until the lifetime is ended, that is, a writable limit amount in the product shipment state. The total writable amount X is calculated by the following equation.

$$\text{(Total Writable Amount } X\text{)}=\text{(Physical Capacity of Apparatus)}\times\text{(Number of Rewritable Times)} \quad (1)$$

Herein, the value obtained by dividing the total writable amount X by the write amplification ratio becomes the limit amount of the accumulated amount of the user data which can be transmitted from the host to the semiconductor memory apparatus. Hereinafter, the limit amount of the accumulated amount of the user data which can be transmitted from the host to the semiconductor memory apparatus is referred to as a total transmissible amount.

The write amplification ratio is a value indicating how much more the write amount of an actually occurring summation is than the write amount of the one-unit user data (data for which the write request is issued from the host). This value depends on how many the value (hereinafter, referred to as a surplus capacity) obtained by subtracting a nominal capacity of the semiconductor memory apparatus from a physical capacity of the semiconductor memory apparatus is included. The NAND memory can perform a data erase operation in unit called a block which is larger than a write unit called a page. On the other hand, if data is not erased in advance, the NAND memory may not write new data. Therefore, in order to continuously perform the writing, the NAND memory needs to have the surplus capacity. In addition, when the blocks corresponding to the surplus capacity are written, a writable block (hereinafter, referred to as a free block) needs to be produced by erasing old data which becomes invalid due to the new writing. Actually, one block is rarely full of old data. In most cases, the free block is produced by filling and moving (copying) a small amount of valid data remained in the block to other blocks, and at this time, unnecessary write operation involved in the moving may not be avoided. The process of producing the newly writable block is called compaction.

In addition, actually, the writing into the NAND memory includes writing of user data, writing involved in the moving through the compaction, writing for allowing a table for management of physical location of the write data to become non-volatile, writing for allowing a variety of log information to become non-volatile, and writing according to data moving involved in execution of wear leveling.

Figure 2:
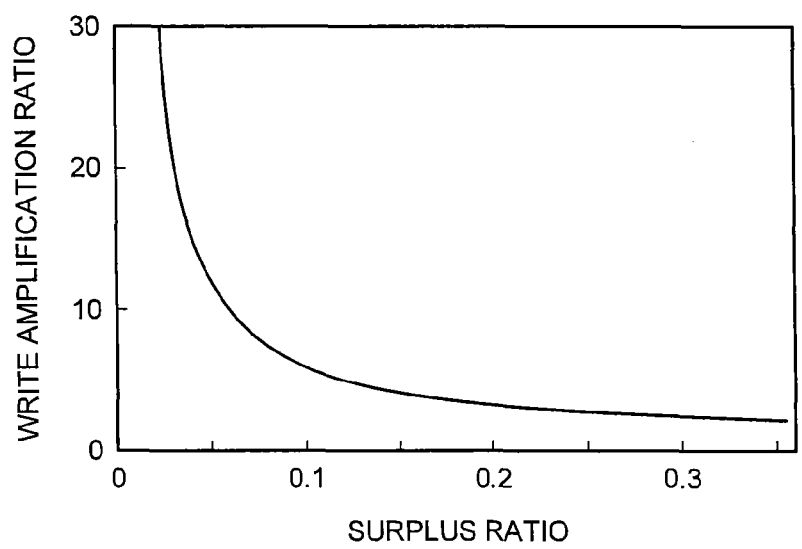
FIG. 2 is a diagram for explaining a relationship between a surplus ratio and a write amplification ratio.

FIG. 2 is a diagram for explaining a relation between a surplus ratio and a write amplification ratio. Herein, a value obtained by dividing a surplus capacity by a physical capacity of an apparatus is referred to as a surplus ratio. According to the compaction, a free block is generated, for example, from a block where the smallest amount of valid data is retained. Therefore, as the amount of the valid data retained in the block where the smallest amount of the valid data is retained is small, the efficiency of compaction is increased (in other words, the free block can be generated by using a small number of copy operations). On the other hand, in comparison with the case where the surplus ratio is small, in the case where the surplus ratio is large, the block can be left alone without performing the compaction until the invalid data is further increased. As a result, as the surplus ratio is increased, the efficiency of compaction is improved. In other words, as illustrated in FIG. 2, as the surplus ratio is increased, the write amplification ratio is decreased.

In addition, in the case where a work load can be considered, the write amplification ratio to the surplus ratio can be obtained by calculation. In other words, the relation illustrated in FIG. 2 can be obtained in advance. For example, as the spontaneously generated worst case, if data having a size equal to a page which is a minimum unit of writing in a NAND memory are continuously written into the entire nominal capacity of the apparatus at random, in a semiconductor memory apparatus where the surplus capacity is secured to be 25% of the nominal capacity, the write amplification ratio becomes about 2.7. Actually, if a recording amount of write position management information or log information or an efficiency of wear leveling is included, an unnecessary write amount involved in the process needs to be included in the write amplification ratio. However, since the unnecessary write amount involved in the process depends on an employed algorithm for information management or a method of wear leveling, the description thereof is not made herein.

Hereinafter, as an example, description will be made with respect to a case where the nominal capacity of the apparatus is set to 400 GByte, the surplus ratio is set to 25%, the write amplification ratio at the time of product shipment is set to 2.7, the 4-KByte random writing performance is set to 30 Kiops, the number of rewrite times of the MLC-type NAND memory is set to 50,000, and the durable use period is set to 5 years. In this case, the transmissible capacity is obtained as follows.

(Total Transmissible Amount) =                              (2)

(Total Writable Amount $X$) ÷ (Write Amplification Ratio) =

400 GB × 1.25 (multiples) × 50,000 (times) ÷ 2.7 =

9,259 $TB$ (Tera Byte)

Therefore, the maximum amount of one-day writable user data is obtained by considering the to-be-implemented durable use period (guaranteed period) as follows.

9,259 (TB)÷5(years)÷365(days)=5.07 (TB)            (3)

A straight line B of FIG. 1 illustrates a write pace (ideal write pace) of the NAND memory in the case where writing is continuously performed at this pace.

On the other hand, if writing is performed at 30 Kiops which is the maximum performance at the time of random writing of 4-KByte data, 10.6 TB can be written in a day. The straight line A of FIG. 1 illustrates a case where writing is continuously performed at this pace. In this case, the lifetime becomes about 2.5 years. As a guide line for implementing the durable use period of five years, the writing performance needs to be controlled so that the write pace does not exceed the straight line B. In this example, in the case where a semiconductor memory apparatus is allowed to exhibit the maximum performance without consideration of the to-be-achieved durable use period, only 10.6 TB can be written in the NAND memory in a day. Therefore, the write speed needs to be decreased to a maximum of 5.07 TB (namely, by about 50%).

Herein, the surplus capacity is gradually decreased due to the occurrence of a bad block. FIG. 3 is a diagram illustrating a relation between the number of rewrite times and an error rate of a NAND memory, and FIG. 4 is a diagram illustrating time transitions of a surplus capacity and the number of bad blocks.

As illustrated in FIG. 3, after a transient state where an error rate is slightly high as an initial state, a stable time period temporarily passes. After that, a gradual increase in error rate involved in destruction of an insulating film is perceived. The error at the initial state is excluded in a test process before the produce shipment at a factory. Therefore, at the operating period, the semiconductor memory apparatus is configured so that, before the error rate involved in the damage of the insulating film exceeds the level which can be corrected through ECC, a block including a portion where the error rate is likely to exceed the correctable level is set to a bad block and the bad block is prohibited from being used, as measures for preventing data loss in advance. Since the block which is recognized as a bad block may not be used again, as illustrated in FIG. 4, the number of bad blocks is increased as time elapses, and the surplus capacity is decreased as the number of bad blocks is increased.

In this manner, since the surplus capacity is gradually decreased according to the increase in the number of bad blocks, when the guaranteed period is expired, the total writable amount is decreased from the position X down to the position Y1 of FIG. 1. If the speed control is executed based on the straight line B without consideration of this effect, the lifetime is ended before the to-be-achieved durable use period. Since the rate of decrease in surplus capacity is an undefined value influenced by a quality of a NAND memory or a use environment of a semiconductor memory apparatus, it is difficult to estimate the rate of decrease in surplus capacity. Therefore, in the embodiment of the present invention, instead of the estimation of the decrease in surplus capacity, the process of the decrease in surplus capacity is fed back, and a value corresponding to a curve (a straight line C of FIG. 1) of an ideal write pace which varies according to a quality of a NAND memory or a use environment of an apparatus is directly calculated. In addition, since the semiconductor memory apparatus according to the embodiment uses an ideal write pace dynamically obtained in order to limit the writing performance, hereinafter, the dynamically-obtained ideal write pace is referred to as a permissible write pace.

Figure 5:
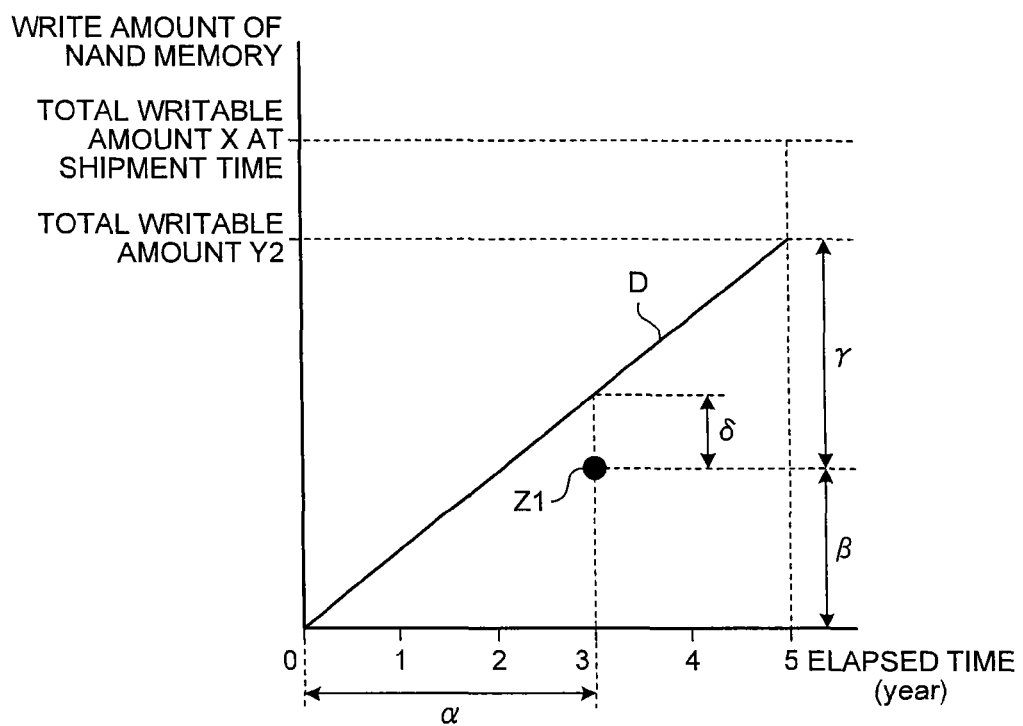
FIG. 5 is a diagram for explaining features of a process of a speed control unit according to a first embodiment.

According to an embodiment of the present invention, a semiconductor memory apparatus includes a speed control unit. Hereinafter, an overview of a process performed by the speed control unit will be described. FIG. 5 is a diagram for explaining features of the process of the speed control unit As illustrated in Z1 of FIG. 5, when the total operation time α elapses, an actual value (total write amount) of an accumulated amount of a write amount of the NAND memory from the time of apparatus shipment reaches β. The speed control unit calculates a time-varying behavior of the permissible value of the accumulated amount of the write amount like the permissible write pace (straight line D), where writing is performed at a constant write speed from the start time to the end time of the guaranteed period and the accumulated amount of the write amount at the end time of the guaranteed period reaches a total writable amount Y2, by using a sum (total writable amount Y2) of a total write amount β and a remaining writable amount (remaining writable amount γ) of existing blocks (that is, blocks not being a bad block) at this time and a total operation time α which is counted from the apparatus shipment time. Therefore, in addition, the permissible write pace is updated every time when the acquisition of the accumulation operation time α and the total write amount β is performed. The speed control unit controls the transmission speed of data transmission from the host so that the time-varying behavior of the total write amount β is continuously less than the permissible write pace which is sequentially updated. In other words, the speed control unit calculates a value (permissible write amount) corresponding to the total operation time α in the obtained permissible write pace. Next, the speed control unit controls the transmission speed of data transmission from the host so that the total write amount β does not exceed the permissible write amount.

In addition, the speed control unit obtains a ratio of the total write amount β to the permissible write amount. In addition, if a difference between the permissible write amount and the total write amount β is set to δ, the ratio can be expressed by β/(δ+β). The speed control unit calculates the setting value Vset of the write speed by using a value according to the parameter β/(δ+β). When the write speed (slope of the straight line A) of the write pace (straight line A) in the case where the maximum performance is exhibited is defined as a maximum write speed Vmax and the write speed (slope of the straight line D) of the permissible write pace (straight line D) is defined as a minimum write speed Vmin, the setting value Vset of the write speed is set to a value according to the β/(δ+β) between the Vmax and the Vmin.

In addition, if the Vset is obtained by applying β/(δ+β) in a linear form, even in the case where the β/(δ+β) is sufficiently small, the setting value Vset of the write speed is set to a value smaller than the Vmax. Therefore, this case is not preferred. Accordingly, the speed control unit does not perform limiting of the speed until the β/(δ+β) exceeds a threshold value N (0<N<1), but the speed control unit starts decreasing the speed from the time when the β/(δ+β) exceeds the threshold value N.

Figure 6:
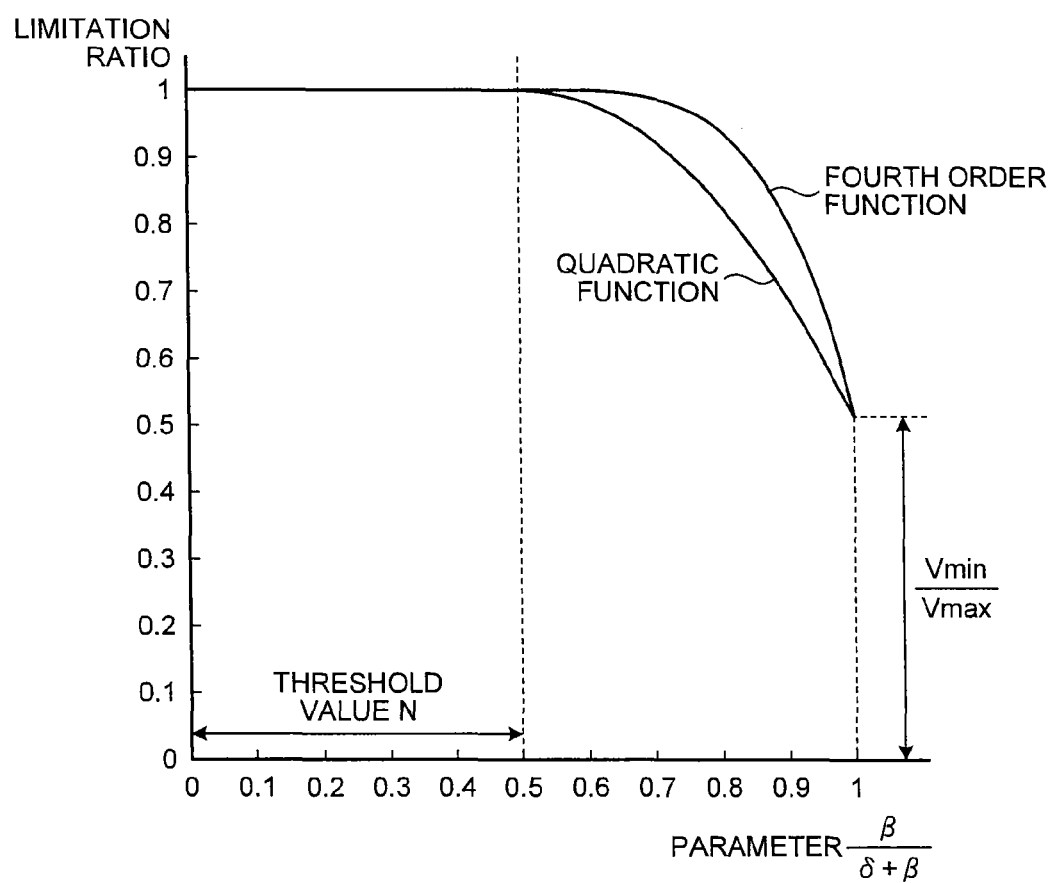
FIG. 6 is a diagram for explaining an example of a relationship between a limitation ratio and a parameter $\beta/(\delta+\beta)$.

FIG. 6 is a diagram for explaining an example of a relation between a limitation ratio of a write speed setting value and a parameter β/(δ+β). In addition, the limitation ratio is a coefficient of 0 or more and 1 or less for deriving the Vset by multiplying the limitation ratio by the Vmax, and as the limitation ratio is smaller, the Vset is set to a smaller value. In this figure, the threshold value N is 0.5. In other words, in the case where the parameter β(δ+β) have a value in a range from 0 to 0.5, the limitation ratio is set to 1. Due to the application of the limitation ratio, the Vmax is set as the Vset. In the case where the parameter β/(δ+β) exceeds 0.5, the limitation ratio is set to be decreased according to an increase in the parameter β/(δ+β) (in other words, the Vset is limited as a smaller value). In addition, in the case where the parameter β/(δ+β) is equal to 1, the limitation ratio is set to Vmin/Vmax. Due to the application of the limitation ratio, the Vmin is set as the Vset. In the case where the parameter β/(δ+β) is in a range from 0.5 to 1, if the relation between the parameter β/(δ+β) and the limitation ratio is a decreasing function satisfying that 1 when β/(δ+β)=0.5 and Vmin/Vmax when β/(δ+β)=1, the relation may be defined by any function excluding a linear function. FIG. 6 illustrates cases where a quadratic function and a fourth order function are applied as examples. In addition, if a linear function is applied, a singular point occurs in a change of speed before and after the threshold value N, the performance is not stabilized in the vicinity thereof.

Figure 7:
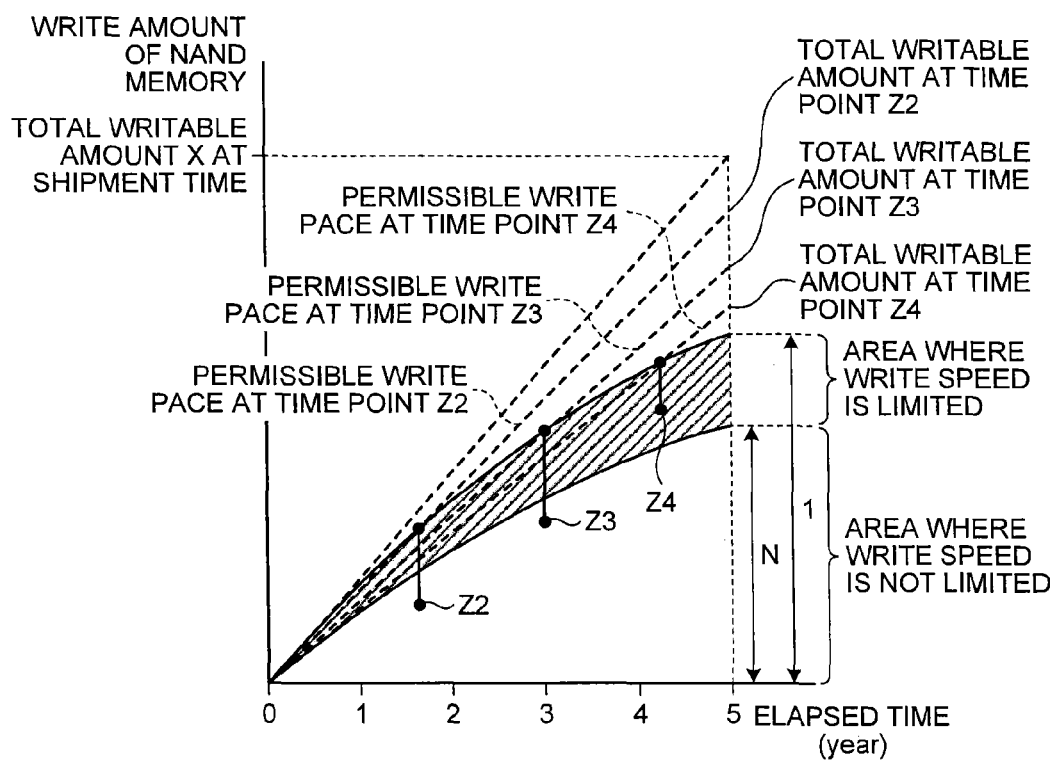
FIG. 7 is a diagram for explaining a case where write speed limiting is performed.

FIG. 7 is a diagram for explaining a case where write speed limiting is performed. In this figure, as an example, permissible write paces corresponding to Z2, Z3, and Z4 are illustrated. Since the limiting of the write speed is performed in the case where the parameter β/(δ+β) exceeds the threshold value N, the area indicated by the hatched portion in FIG. 7 becomes an object of which the write speed setting value Vset is to be decreased.

The speed control unit obtains the setting value Vtset of the data transmission speed from the host to the semiconductor memory apparatus by dividing the obtained write speed setting value Vset by the write amplification ratio. Next, the speed control unit controls data transmission so that the data transmission speed from the host to the semiconductor memory apparatus is equal to Vtset.

Figure 8:
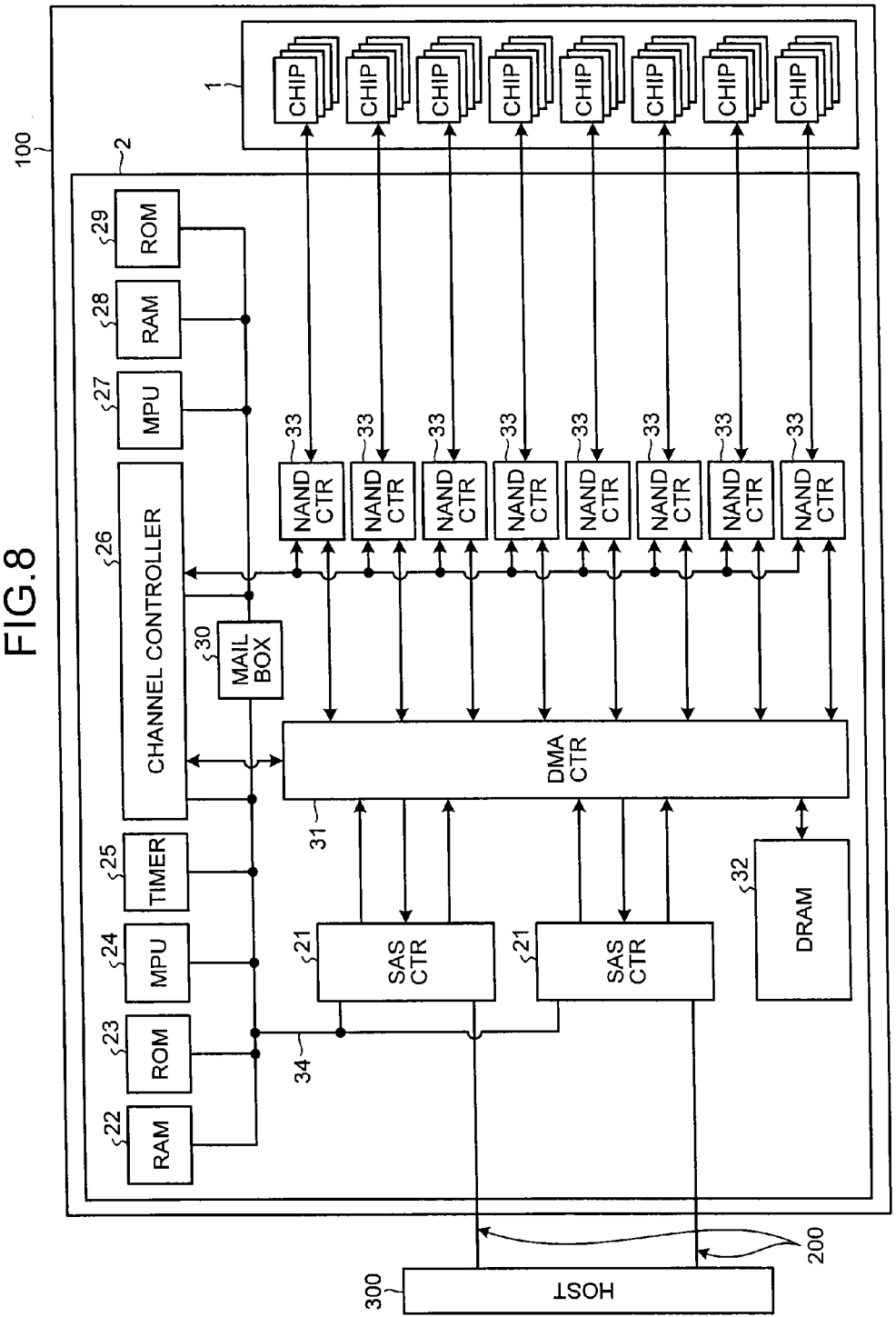
FIG. 8 is a diagram for explaining a configuration of a semiconductor memory apparatus according to the first embodiment of the present invention.

FIG. 8 is a diagram for explaining a configuration of a semiconductor memory apparatus according to a first embodiment of the present invention. As illustrated, the semiconductor memory apparatus 100 is connected through a two-port SAS (Serial Attached Small computer system interface) interface 200 to a host 300 to function as an external memory apparatus of the host 300.

The semiconductor memory apparatus 100 includes a NAND memory 1 which is configured to include a plurality of memory chips including a NAND-type memory cell array and a data transmission device 2 which performs data transmission between the NAND memory 1 and the host 300 through the SAS interface 200.

The data transmission device 2 includes two SAS interface controllers (SAS controllers: SAS CTR) 21, a RAM 22, a ROM 23, a MPU 24, a timer 25, a channel controller 26, an MPU 27, a RAM 28, a ROM 29, a mail box 30, a DRAM controller 31, a DRAM 32, eight NAND controllers 33.

The MPU 24 and the MPU 27 cooperatively function as a speed control unit according to an embodiment of the present invention.

A plurality of the memory chips constituting the NAND memory 1 may be divided into eight groups (channels). One channel includes one or more memory chips. The memory chips of each channel are connected to the corresponding NAND controller 33 among the eight NAND controllers 33. Each NAND controller 33 can independently perform read/write/erase with respect to the memory chips connected to the NAND controller 33. The data transmission device 2 allows the memory chips of each channel to be operated in parallel, so that it is possible to improve a data transmission speed with respect to the NAND memory 1.

Each of the two SAS controllers 21 is connected to the corresponding port of the two ports constituting the SAS interface 200 to perform data inputting and outputting with respect to the host 300 through the corresponding port connected thereto. The timer 25 is a hardware timer and is configured to allow the MPU 24 to perform period setting, start, stop, and elapsed time read. The timer 25 measures the total operation time α under the control of the MPU 24.

In addition, the two SAS controllers 21 are connected to one DRAM controller 31 which performs inputting and outputting of the DRAM 32. If the host 300 issues write request to the semiconductor memory apparatus 100, the SAS controller 21 receives the write request. The MPU 24 reads the write request received by the SAS controller 21 via a processor bus 34 and performs the write request. The processor bus 34 is connected to the ROM 23 which stores execution codes of the MPU 24 in advance and the RAM 22 which provides a work area to the MPU 24.

When the MPU 24 performs the write request, the MPU 24 secures an area (buffer area) necessary for retaining the data in the DRAM 32 and notifies the number of bytes corresponding to only the secured area to the host 300 in a form of a frame called a Transfer_Ready at the timing based on the setting value Vtset of the data transmission speed. More specifically, the MPU 24 requests the SAS controller 21 to issue the Transfer_Ready frame. The production of the Transfer_Ready frame and the transmission to the host 300 are performed by the SAS controller 21 based on the requested nexus received from the MPU 24 and the number of data transmission bytes. The host 300 transmits user data having the number of bytes permitted in the Transfer_Ready frame to the semiconductor memory apparatus 100.

Herein, the MPU 24 controls a timing of issuing the Transfer_Ready frame so that a data transmission speed from the host 300 to the semiconductor memory apparatus 100 is equal to a separately-calculated setting value Vtset.

Figure 9:
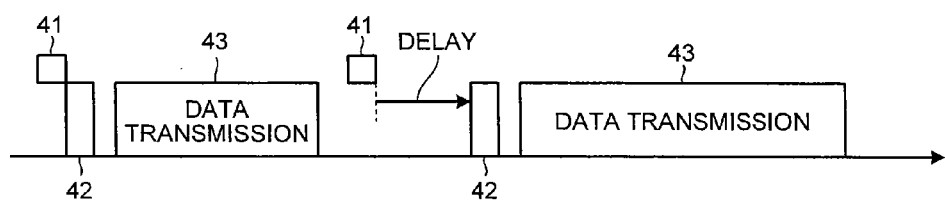
FIG. 9 is a diagram for explaining a timing of issuing a Transfer_Ready frame.

FIG. 9 is a diagram for explaining the timing of issuing the Transfer_Ready frame. As illustrated, after the acquisition of the buffer area in the DRAM 32 is performed (Reference Numeral 41), the MPU 24 issues the Transfer_Ready frame where transmission of data corresponding to the acquired buffer area is allowable to the SAS controller 21 (Reference Numeral 42). Next, the SAS controller 21 receives user data having a size of the acquired buffer area (Reference Numeral 43). After the acquisition of the buffer area is performed, until the time obtained by dividing the size of the buffer area by Vtset elapses, the MPU 24 delays the issuing of the next Transfer_Ready frame. By doing so, the MPU 24 allows the average value of the data transmission speed to be equal to Vtset.

In addition, in the embodiment, even in the case where FC (Fiber Channel) instead of the SAS interface 200 is used as a communication interface between the host 300 and the semiconductor memory apparatus 100, the data transmission speed can be controlled by adjusting the timing of issuing the Transfer_Ready frame. In addition, in the case where SATA (Serial Advanced Technology Attachment) is used as a communication interface, the speed control unit can control the data transmission speed, for example, by appropriately transmitting a hold command to the host 300.

User data transmitted from the host 300 to the semiconductor memory apparatus 100 is transmitted through the SAS controller 21 to the DRAM controller 31. The DRAM controller 31 stores the transmitted user data in a location in the DRAM 32 designated by the MPU 24. If the SAS controller 21 receives the user data of the permitted number of bytes in the Transfer_Ready frame, the SAS controller 21 divides the received user data in units of a minimum write unit of the NAND memory 1 and issues write commands for writing each item of the divided data of the user data in the NAND memory 1 to the channel controller 26. At this time, each write command includes a leading logical address of the minimum write unit and a leading address of the DRAM 32 which retains the data, but it does not include a physical write location of the NAND memory 1. Therefore, herein, the write command of the user data in the minimum write unit issued by the channel controller 26 is referred to as a logical write command.

Management of the physical data location of the NAND memory 1 is performed by the MPU 27. The MPU 27 supplies a physical block address of the NAND memory 1 corresponding to all the channels where writing can be performed according to the logical write commands to the channel controller 26 in advance, and the channel controller 26 distributes the logical write commands to the channels in a stripe form page by page from the leading address of the supplied physical block, so that parallel writing can be performed so as to earn the write speed. When all the physical block addresses supplied by the channel controller 26 are written, the MPU 27 supplies a new physical block address to the channel controller 26. The MPU 27 measures the total write amount β by integrating the total write amount β of the NAND memory 1 into the supplied amount of the physical block addresses.

As long as the valid physical block supplied for the writing of the user data exists, the channel controller 26 updates the channel in a round robin method with respect to user write commands issued by the MPU 24, adds a physical page address of a write site thereto, and stores the commands in a logical write command queue (not shown) in the channel controller 26.

In a non-volatile semiconductor memory where write unit and erase unit are different such as the NAND memory 1, although invalid old data remains in an updated and written page, valid data also exists in a block in which the page is included. In order to recover a free block, the compaction is performed. In general, the compaction is performed during the time interval when the NAND memory 1 does not process a command so as not to cause deterioration in performance of the semiconductor memory apparatus 100. However, in the time interval when write request is frequently issued, since the location where writing is to be newly performed needs to be secured according to the pace, the compaction is processed in such a form that it is inserted during the read/write processes of the user data. In addition to the logical write command queue storing the user write commands issued from the MPU 24, the channel controller 26 has a physical read/write command queue storing compaction commands issued from the MPU 27. The commands in the two queues are mixed in a ratio designated by the MPU 27 and performed by the NAND controller 33 of each channel.

When the free blocks are lacking, the ratio is controlled so that the execution from the compaction queue is preferentially performed. The block where the compaction is to be performed is selected by the MPU 27. During the compaction, in order to allow the numbers of erase times of the blocks to be equalized if possible, the MPU 27 needs to move the data occasionally by using a wear leveling method. The operation of the wear leveling is substantially equivalent to the compaction, but the to-be-moved data is selected based on a criterion different from that of compaction candidate data.

Since the numbers of erase times of the blocks are equalized by using the wear leveling, the MPU 27 accurately recognizes the existing blocks and the numbers of erase times of the existing blocks. The MPU 27 calculates the remaining writable amount γ by integrating the remaining numbers of update times of the blocks into all the existing blocks (that is, blocks other than bad blocks).

The MPU 24 collects the remaining writable amount γ through the mail box 30 from the MPU 27 and calculates the setting value Vtset of the data transmission speed.

The ROM 29 stores execution codes of the MPU 27 in advance, and the RAM 28 provides a work area to the MPU 27.

Next, operations of the speed control unit of the semiconductor memory apparatus 100 according to the first embodiment of the present invention will be described.

Figure 10:
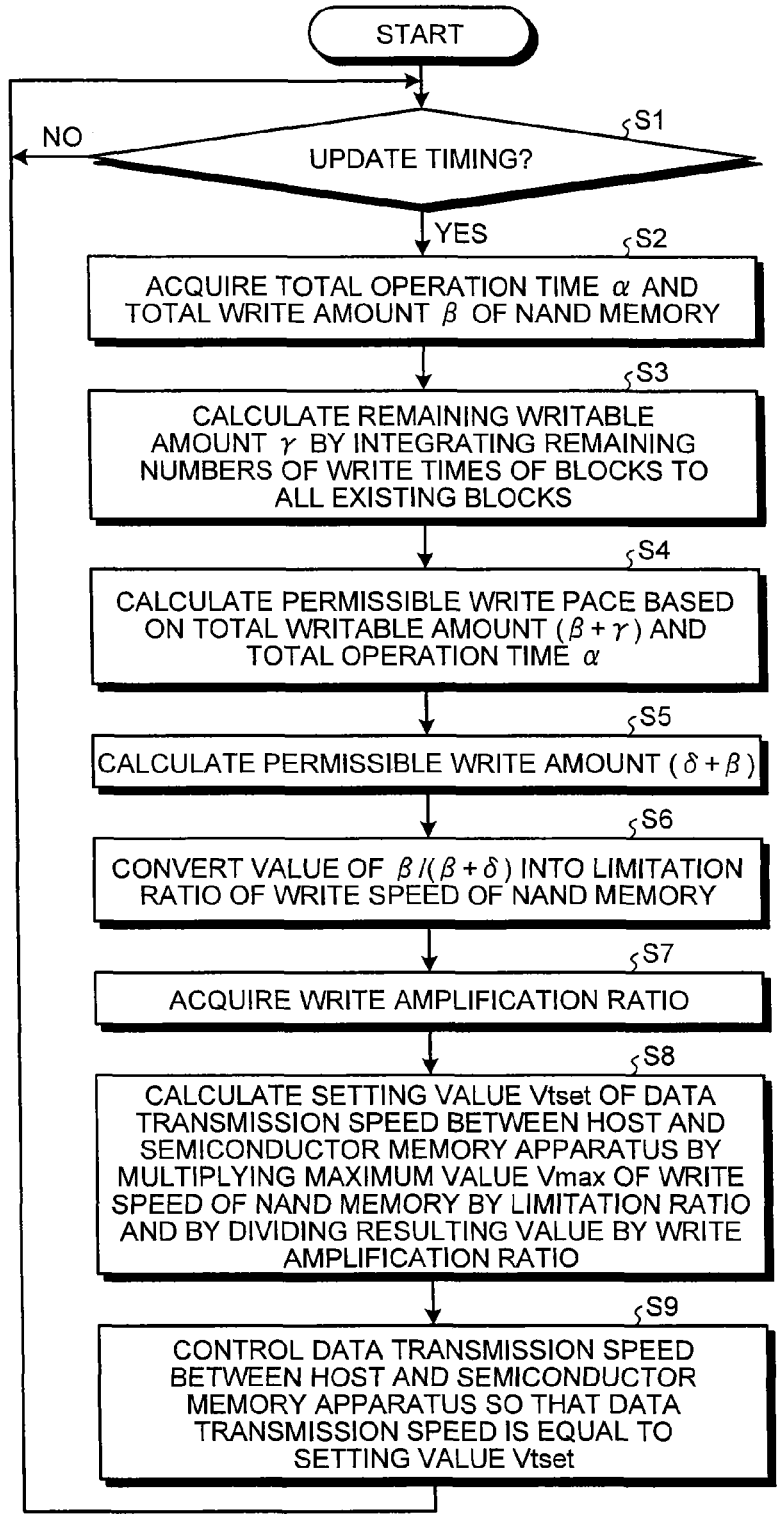
FIG. 10 is a flowchart for explaining operations of a speed control unit of a semiconductor memory apparatus according to the first embodiment.

FIG. 10 is a flowchart for explaining the operations of the speed control unit of the semiconductor memory apparatus 100 according to the first embodiment. As illustrated, the MPU 24 first determines whether or not the current timing is the timing of updating the data transmission speed Vtset (Step S1). In the case where the current timing is determined not to be the timing of updating the data transmission speed Vtset (No in Step S1), the MPU 24 performs the determination process of Step S1.

In addition, the timing of updating the data transmission speed Vtset may be defined in any way. For example, in the case where a predetermined operation time (for example, 24 hours) elapses from the previous update timing, the MPU 24 may determine that the current timing reaches the timing of updating the data transmission speed Vtset. The elapsed time is measured by using, for example, the timer 25.

In addition, the timing when the occurrence of a predetermined number of bad blocks is sensed may be set to the timing of updating the data transmission speed Vtset. In some configuration, the occurrence of bad blocks may be sensed by, for example, the MPU 27, and a message indicating that the MPU 27 senses the occurrence of bad blocks may be notified through the mail box 30 to the MPU 24.

In the case where the current timing is determined to be the timing of updating the data transmission speed Vtset (Yes in Step S1), the MPU 24 acquires the total operation time α from the timer 25 and acquires the total write amount β of the NAND memory 1 from the mail box 30 (Step S2).

The MPU 27 calculates the remaining writable amount γ by integrating the remaining numbers of rewritable times of blocks for all the existing blocks (Step S3). The calculated remaining writable amount γ is transmitted through the mail box 30 to the MPU 24.

Subsequently, the MPU 24 calculates the permissible write pace at the update timing based on the total writable amount (β+γ) and the total operation time α (Step S4).

Next, the MPU 24 obtains the permissible write amount (δ+β) at the update timing based on the calculated permissible write pace (Step S5).

Next, the MPU 24 converts β/(δ+=) into the limitation ratio of the write speed (Step S6). The conversion of β/(δ+β) into the limitation ratio can be easily implemented, for example, by referring to a predetermined lookup table with respect to a relation between β/(δ+β) and the limitation ratio. In addition, a function defining the relation between β/(δ+β) and the limitation ratio is recorded in a memory apparatus such as the ROM 23, and the conversion can be implemented by operating the function to the calculated β/(δ+β).

Next, the MPU 24 acquires the write amplification ratio (Step S7).

The acquisition of the write amplification ratio can be implemented, for example, by calculating the surplus ratio from the number of bad blocks and by referring to a prepared lookup table which describes a relation between the surplus ratio and the write amplification ratio by setting the calculated surplus ratio as a search key.

In addition, the MPU 24 may record a total amount of write data of which writing is completed and calculate the write amplification ratio by dividing the total amount of the write data by the total write amount β. The total amount of the write data of which the writing is completed can be calculated, for example, based on the write request received from the host 300.

In addition, the MPU 24 may calculate the write amplification ratio by dividing the total amount of the write data within a latest defined time interval up to the current update timing by the total write amount of the NAND memory 1 within the defined time interval.

Subsequently, the MPU 24 calculates the setting value Vtset of the data transmission speed of the write data from the host 300 to the semiconductor memory apparatus 100 by multiplying the maximum value Vmax of the write speed of the NAND memory 1 by the limitation ratio obtained in the process of Step S6 and by dividing the resulting value by the write amplification ratio obtained in the process of Step S7 (Step S8).

Next, the MPU 24 controls the data transmission speed so that the data transmission speed of the write data from the host 300 to the semiconductor memory apparatus 100 is equal to the Vtset (Step S9). After that, the MPU 24 performs the determination process of Step S1 again.

In this manner, according to the first embodiment of the present invention, the timer 25 measures the total operation time counted from the start time of the guaranteed period. The MPU 27 measures a total write amount β which is an accumulated amount of data which is written in the NAND memory 1 and calculates a remaining writable amount γ which is an accumulated amount of data which is writable in the NAND memory 1 in a remaining time interval of the guaranteed period based on the number of remaining rewritable times of existing blocks. The MPU 24 calculates a permissible value of a write speed with respect to the NAND memory 1, where after the start of the guaranteed period, data is written in the NAND memory 1 at a write speed equal to the permissible value so that an accumulated amount of data written in the NAND memory 1 at an end time of the guaranteed period is equal to a sum of β and γ. In addition, the MPU 24 controls the transmission speed of write data from the host 300 so that the write speed of the NAND memory 1 does not exceed the calculated permissible value. Therefore, even in the case where the surplus capacity of the NAND memory 1 is decreased according to the increase in the number of bad blocks, the semiconductor memory apparatus 100 controls the data transmission speed between the host 300 and the semiconductor memory apparatus 100 so that the decrease in the surplus capacity is appropriately fed back to the permissible write pace and the actual write pace of the NAND memory 1 does not exceed the permissible write pace. Accordingly, it is possible to prevent the lifetime of the memory from being ended within the guaranteed period without depending on a use environment, a use method, or a variation in the production of the memory cells of the NAND memory 1.

In addition, the MPU 24 obtains the permissible write amount (δ+β) and calculates the setting value Vset between the write speed Vmin and the maximum value Vmax of the write speed of the permissible write pace based on the ratio β/(δ+β) of the total write amount β to the permissible write amount (δ+β). Next, since the MPU 24 is configured to calculate the setting value Vtset by dividing Vset by the write amplification ratio and to control the transmission speed so that the transmission speed of the data transmission from the host 300 is equal to Vtset, the data transmission speed between the host 300 and the semiconductor memory apparatus 100 can be controlled so that an actual write pace for the NAND memory 1 does not exceed the permissible write pace.

In addition, the MPU 24 is configured so that, in the case where the parameter β/(δ+β) is in a range from 0 to a predetermined threshold value, the Vmax is set as the Vset, in the case where the parameter β/(δ+β) is in a range from the predetermined threshold value to 1, the value based on the relation which the transmission speed is monotonously decreased from the Vmax to the Vmin according to an increase in the parameter β/(δ+β) is set as the Vset, and in the case where the parameter β/(δ+β) is 1, the Vmin is set as the Vset. Therefore, it is possible to prevent the problem in that the transmission speed with respect to the host 300 is limited although the total write amount β is sufficiently small in comparison with the permissible write amount (δ+β).

In addition, since the MPU 24 is configured so as to obtain the surplus ratio based on the number of existing blocks and to calculate the write amplification ratio corresponding to the obtained surplus ratio based on the relation between predetermined surplus ratio and write amplification ratio, the write amplification ratio can be simply obtained.

In addition, if the relation between the surplus ratio and the write amplification ratio is defined by taking into consideration the work load of the worst cases, there is a problem in that the transmission speed is limited too strictly more than necessary in the operation start time of an actual environment. However, on the contrary, as the semiconductor memory apparatus 100 reaches the lifetime, the transmission speed is transitioned in such a direction that the limiting is alleviated. This feature operates in such a direction that the feature that the transmission speed is limited strictly due to an increase in the number of bad blocks according to the time is alleviated.

In addition, the MPU 24 may calculate the write amplification ratio by measuring the actual value of the accumulated amount of the transmission data transmitted from the host 300 and by dividing the measured actual value of the accumulated amount of the transmission data by the total write amount β.

In addition, when the transmission data transmitted from the host 300 is received, the MPU 24 delays the next data transmission by the time obtained by dividing the size of the buffer area for storing the transmission data (that is, the size of the received transmission data) by Vtset. Accordingly, the transmission speed of the transmission data transmitted from the host 300 can be allowed to be equal to Vtset.

Figure 11:
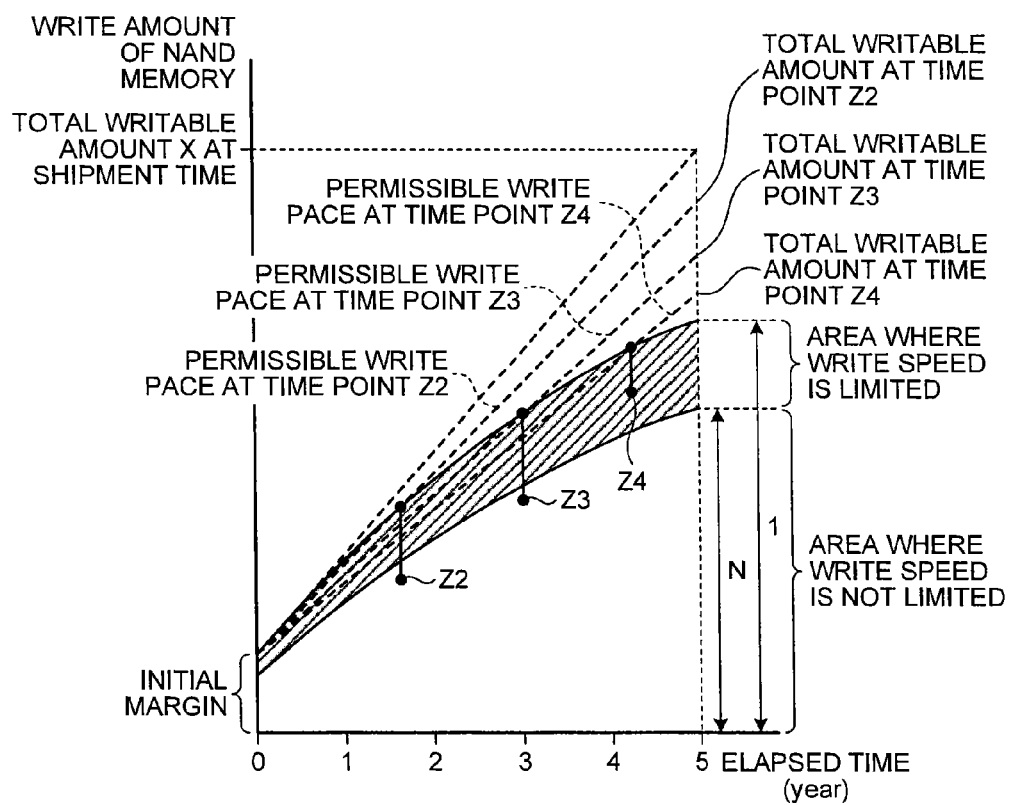
FIG. 11 is a diagram for explaining features of a process of a speed control unit according to a second embodiment.

In the first embodiment, the MPU 24 is configured to calculate the permissible write pace by setting the write amount at the starting time of the guaranteed period of the semiconductor memory apparatus 100 to 0. However, in the case where the initial value of the permissible write pace is set to 0, the control is too sensitive at the time of starting the use, so that the performance of the semiconductor memory apparatus 100 becomes unstable. Therefore, as illustrated in FIG. 11, the MPU 24 may calculate the permissible write pace as an initial value of a predetermined margin value (initial margin). By doing so, since the limiting of the transmission speed is not started until the total write amount β exceeds at least 1/N of the initial margin, it is possible to prevent the control from being unstable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory apparatus comprising:
   a non-volatile semiconductor memory which includes a plurality of blocks having an upper limit in the number of rewrite times;
   a time measurement unit which measures a total operation time counted from a start time of a guaranteed period;
   a first capacity measurement unit which measures a first capacity which is an actual value of an accumulated amount of data written in the non-volatile semiconductor memory;
   a second capacity calculation unit which calculates a second capacity which is an accumulated amount of data which is writable in the non-volatile semiconductor memory in a remaining time interval of the guaranteed period based on the number of remaining rewritable times of existing blocks among the plurality of the blocks; and
   a speed control unit which calculates a time-varying behavior of a permissible value of the accumulated amount of data written in the non-volatile semiconductor memory, where, after the start of the guaranteed period, data is written in the non-volatile semiconductor memory at a constant write speed so that the permissible value at an end time of the guaranteed period is equal to a sum of the first capacity and the second capacity, and which controls a transmission speed of transmission data from outside so that the first capacity does not exceed the permissible value at the timing of measuring the first capacity.

2. The semiconductor memory apparatus according to claim 1, wherein the speed control unit calculates a first speed setting value between a write speed of the permissible value and a maximum speed value taken for the writing of the non-volatile semiconductor memory based on a first ratio of the first capacity for the permissible value at the timing of measuring the first capacity, calculates a second speed setting value by dividing the first speed setting value by a write amplification ratio, and controls the transmission speed of the transmission data transmitted from the outside so that the transmission speed of the transmission data transmitted from the outside is equal to the second speed setting value.

3. The semiconductor memory apparatus according to claim 2, wherein the speed control unit sets the maximum speed value as the first speed setting value in the case where the first ratio is in a range from 0 to a predetermined threshold value, sets a value based on a pre-defined relationship where the transmission speed is continuously decreased from the maximum speed value to the write speed of the permissible value according to an increase in the first ratio as the first speed setting value in the case where the first ratio is in a range from the predetermined threshold value to 1, and sets the write speed of the permissible value as the first speed setting value in the case where the first ratio is 1.

4. The semiconductor memory apparatus according to claim 2, wherein the speed control unit obtains a second ratio of the surplus capacity with respect to a nominal capacity of the non-volatile semiconductor memory based on the number of the existing blocks and calculates the write amplification ratio based on a pre-defined relationship with respect to the second ratio.

5. The semiconductor memory apparatus according to claim 2, further comprising a third capacity measurement unit which measures a third capacity which is an actual value of an accumulated amount of data transmitted from the outside,
   wherein the speed control unit calculates the write amplification ratio by dividing the first capacity by the third capacity.

6. The semiconductor memory apparatus according to claim 2, wherein, when the speed control unit receives the transmission data transmitted from the outside, the speed control unit allows the transmission speed of the transmission data transmitted from the outside to be equal to the second speed setting value by delaying next data transmission by a time obtained by dividing a size of the received transmission data by the second speed setting value.

7. The semiconductor memory apparatus according to claim 1, wherein the speed control unit calculates the time-varying behavior of the permissible value by setting a pre-defined positive margin value as an initial value.

8. The semiconductor memory apparatus according to claim 7, wherein the speed control unit calculates a first speed setting value between a write speed of the permissible value and a maximum speed value taken for the writing of the non-volatile semiconductor memory based on a first ratio of the first capacity for the permissible value at the timing of measuring the first capacity, calculates a second speed setting value by dividing the first speed setting value by a write amplification ratio, and controls the transmission speed of the transmission data transmitted from the outside so that the transmission speed of the transmission data transmitted from the outside is equal to the second speed setting value.

9. The semiconductor memory apparatus according to claim 8, wherein, when the speed control unit receives the transmission data transmitted from the outside, the speed control unit allows the transmission speed of the transmission data transmitted from the outside to be equal to the second speed setting value by delaying next data transmission by a time obtained by dividing a size of the received transmission data by the second speed setting value.

10. A data transmission device which writes write data transmitted from outside in a non-volatile semiconductor memory including a plurality of blocks having an upper limit in the number of rewrite times, the apparatus comprising:

a time measurement unit which measures a total operation time counted from a start time of a guaranteed period;

a first capacity measurement unit which measures a first capacity which is an actual value of an accumulated amount of data written in the non-volatile semiconductor memory;

a second capacity calculation unit which calculates a second capacity which is an accumulated amount of data which is writable in the non-volatile semiconductor memory in a remaining time interval of the guaranteed period based on the number of remaining writable times of existing blocks among the plurality of the blocks; and a speed control unit which calculates a time-varying behavior of a permissible value of the accumulated amount of data written in the non-volatile semiconductor memory, where, after the start of the guaranteed period, data is written in the non-volatile semiconductor memory at a constant write speed so that the permissible value at an end time of the guaranteed period is equal to a sum of the first capacity and the second capacity, and which controls a transmission speed of the transmission data transmitted from the outside so that the first capacity does not exceed the permissible value at the timing of measuring the first capacity.

11. The data transmission device according to claim 10, wherein the speed control unit calculates a first speed setting value between a write speed of the permissible value and a maximum speed value of writing of the non-volatile semiconductor memory based on a first ratio of the first capacity to the permissible value at the timing of measuring the first capacity, calculates a second speed setting value by dividing the first speed setting value with a write amplification ratio, and controls the transmission speed of the transmission data transmitted from the outside so that the transmission speed of the transmission data transmitted from the outside is equal to the second speed setting value.

12. The data transmission device according to claim 11, wherein the speed control unit obtains a second ratio of the surplus capacity with respect to a nominal capacity of the non-volatile semiconductor memory based on the number of the existing blocks and calculates the write amplification ratio based on a pre-defined relationship with respect to the second ratio.

13. The data transmission device according to claim 11, wherein when the speed control unit receives the transmission data transmitted from the outside, the speed control unit allows the transmission speed of the transmission data transmitted from the outside to be equal to the second speed setting value by delaying next data transmission by a time obtained by dividing a size of the received transmission data by the second speed setting value.

14. The data transmission device according to claim 10, wherein the speed control unit calculates the time-varying behavior of the permissible value by setting a pre-defined positive margin value as an initial value.

15. The data transmission device according to claim 14, wherein the speed control unit calculates a first speed setting value between a write speed of the permissible value and a maximum speed value of writing of the non-volatile semiconductor memory based on a first ratio of the first capacity to the permissible value at the timing of measuring the first capacity, calculates a second speed setting value by dividing the first speed setting value with a write amplification ratio, and controls the transmission speed of the transmission data transmitted from the outside so that the transmission speed of the transmission data transmitted from the outside is equal to the second speed setting value.

16. The data transmission device according to claim 15, wherein when the speed control unit receives the transmission data transmitted from the outside, the speed control unit allows the transmission speed of the transmission data transmitted from the outside to be equal to the second speed setting value by delaying next data transmission by a time obtained by dividing a size of the received transmission data by the second speed setting value.

17. A recording method of writing write data transmitted from a outside in a non-volatile semiconductor memory including a plurality of blocks having an upper limit in the number of rewrite times, comprising:

calculating a first speed setting value at a predetermined timing;

controlling a transmission speed of transmission data transmitted from the outside so that the transmission speed of transmission data transmitted from the outside is equal to the calculated first speed setting value; and writing the write data which is transmitted from the outside and of which the transmission speed is controlled in the non-volatile semiconductor memory, wherein the calculating the first speed setting value includes measuring a total operation time counted from a start time of a guaranteed period, measuring a first capacity which is an actual value of an accumulated amount of data written in the non-volatile semiconductor memory, calculating a second capacity which is an accumulated amount of data which is writable in the non-volatile semiconductor memory in a remaining time interval of the guaranteed period based on the number of remaining writable times of existing blocks among the plurality of the blocks, calculating a time-varying behavior of a permissible value of the accumulated amount of data written in the non-volatile semiconductor memory, where, after the start of the guaranteed period, data is written in the non-volatile semiconductor memory at a constant write speed so that the permissible value at an end time of the guaranteed period is equal to a sum of the first capacity and the second capacity, and calculating the first speed setting value so that the first capacity does not exceed the permissible value at the timing of measuring the first capacity.

18. The recording method according to claim 17, wherein the calculating the first speed setting value so that the write speed of the non-volatile semiconductor memory does not exceed the permissible value includes calculating a second speed setting value between a write speed of the permissible value and a maximum speed value taken for the writing of the non-volatile semiconductor memory based on a first ratio of the first capacity to the permissible value at the predetermined timing, and calculating the first speed setting value by dividing the second speed setting value by a write amplification ratio.

19. The recording method according to claim 17, wherein the calculating of the time-varying behavior of the permissible value includes calculating the time-varying behavior of the permissible value by setting a pre-defined positive margin value as an initial value.

20. The recording method according to claim 17, wherein the predetermined timing is each timing when a predetermined time elapses or a timing when a bad block newly occurs.

* * * * *